United States Patent [19]

Nakamori

[11] Patent Number: 5,715,170
[45] Date of Patent: Feb. 3, 1998

[54] APPARATUS FOR FORMING INPUT DATA FOR A LOGIC SIMULATOR

[75] Inventor: Tutomu Nakamori, Kawasaki, Japan

[73] Assignee: Fujitsu Limited, Kawasaki, Japan

[21] Appl. No.: 424,624

[22] Filed: Apr. 19, 1995

[30] Foreign Application Priority Data

Apr. 20, 1994 [JP] Japan ................ 6-081761

[51] Int. Cl.$^6$ .................................................. G06F 17/50
[52] U.S. Cl. .......................... 364/490; 364/488; 364/578
[58] Field of Search ........................... 364/488, 489, 364/578, 490

[56] References Cited

U.S. PATENT DOCUMENTS

| 5,197,015 | 3/1993 | Hartoog et al. | 364/490 |
|---|---|---|---|
| 5,210,699 | 5/1993 | Harrington | 364/488 |
| 5,381,345 | 1/1995 | Takegami et al. | 364/491 |
| 5,446,674 | 8/1995 | Ikeda et al. | 364/489 |
| 5,461,579 | 10/1995 | Misheloff et al. | 364/491 |
| 5,469,366 | 11/1995 | Yang et al. | 364/489 |
| 5,475,605 | 12/1995 | Lin | 364/488 |

*Primary Examiner*—Vincent N. Trans
*Attorney, Agent, or Firm*—Nikaido, Marmelstein, Murray & Oram LLP

[57] ABSTRACT

An apparatus for forming input data for a logic simulator executes the operation processing so as to convert a net list using elements as bases into a net list using cell units as bases, and feeds the net list to a logic simulator. The apparatus for forming input data for a logic simulator is constituted by a processing device which, for a net list which uses elements as units and is constituted by connection data among the elements including parasitic resistances and parasitic capacitances, feeds, to a logic simulator, the data related to nets, parasitic resistances and parasitic capacitances but excluding those nets, and parasitic resistances and parasitic capacitances that are completed in a cell.

13 Claims, 9 Drawing Sheets

```
MODEL CIR1
 INPUT  X,Y
 OUTPUT Z
 I01 Z X A01 NAND2
 I02 A01 Y INV
END MODEL
```

Fig.5

| SUBCIRCUIT | CELL NAME | TERMINAL | | | | TYPE | LENGTH X | WIDTH Y |
|---|---|---|---|---|---|---|---|---|
| .SUBCKT | NAND2 | OUT | IN1 | IN2 | | | | |
| M101 | | OUT | VDD | VDD | | P | $X_1$ | $Y_1$ |
| M102 | | OUT | IN2 | VDD | | P | $X_2$ | $Y_2$ |
| M001 | | OUT | IN1 | O1 | | N | $X_3$ | $Y_3$ |
| M002 | | O1 | IN2 | VSS | | N | $X_4$ | $Y_4$ |
| .ENDS | | | | | | | | |

Fig. 9

```
C1153   49    VSS    0.0467p
C1154   50    VSS    0.1026p
C1155   51    VSS    0.0423p
C1156   52    VSS    0.1755p
C1157   53    VSS    0.0847p
C1158   54    VSS    0.0467p
C1159   55    VSS    0.1270p
C1160   56    VSS    0.1600p
C1161   57    VSS    0.2134p
C1162   58    VSS    0.0584p
C1190   90    VSS    0.0027p

R1106   52    50     415.6250
R1107   53    52     2.6350
R1108   53    49     3012.5000
R1109   55    54     2912.5000
R1110   55    53     0.6325
R1111   56    55     6.2975
R1112   56    48     350.0000
R1113   57    56     7.0800
R1114   57    38     6.3275
R1115   58    57     3775.0000

M1    51 52 0 0  NCH L=0.8 W=4
M101  51 52 1 1  PCH L=0.8 W=8
M2    49 51 0 0  NCH L=0.8 W=4
M102  49 51 1 1  PCH L=0.8 W=8
M3    53 58 0 0  NCH L=0.8 W=4
M103  53 58 1 1, PCH L=0.8 W=8
```

APPARATUS FOR FORMING INPUT DATA FOR A LOGIC SIMULATOR

BACKGROUND OF THE INVENTION

1. Field of the Invention

The present invention relates to an apparatus for forming input data for a logic simulator that is used for verifying timings in a semiconductor integrated circuit. More, particularly, the invention relates to an apparatus for forming input data for a logic simulator which makes it possible to easily verify the timings of a semiconductor integrated circuit, fabricated by a full manual layout system, by using a logic simulator.

2. Description of the Related Art

Accompanying the trend toward high-speed operation and high degree of integration of semiconductor devices in recent years, it has become necessary to verify timings at high speeds even in a full manual layout system which has a degree of integration higher than that of the cell-based layout system or the gate array system.

For this purpose, use has heretofore been made of a circuit simulator which has been known as SPICE and a switch level simulator for effecting the simulation by regarding MOS devices as switches imposing, however, limitations on the number of devices and on the number of nets that can be tested and requiring very extended periods of processing time.

That is, in designing the semiconductor integrated circuits, so far, the timings of the designed semiconductor integrated circuits have heretofore been verified by either the circuit simulator system as represented by SPICE or the like or the logic simulator system as represented by HILO, Quck-Sim or Verilog. In the circuit simulator system, the layout data of a semiconductor integrated circuit are finely displayed to the level of individual elements, i.e., transistors, to effect the simulation using a program such as SPICE or the like. Therefore, though the precision is very high, the amount of calculation becomes so large that the processing requires extended periods of time and this makes it difficult to verify complex timings at the same time. Therefore, the circuit simulator system could be adapted to simulating the semiconductor integrated circuits on relatively small scales only.

In the logic simulator, on the other hand, the layout data is not displayed as individual devices but are displayed as cells as units or with blocks as units such as AND gates or NOR gates to verify the timings using digital signals. Therefore, the processing speed is low and timings of semiconductor integrated circuits of large scales can only be verified with a precision is inferior to that of the circuit simulator.

So far, the timings of a semiconductor prepared according to the full manual layout system are verified by forming a net list extracting all net data, parasitic resistances and parasitic capacitances from the layout data and inputting it to the simulator.

Unlike the cell-based layout system, however, the full manual layout system does not usually preserve in the layout thereof a hierarchical structure that corresponds to standard cells in the logic circuit diagram or in the net list that serves as a base. With this system, therefore, there is formed a net list consisting of MOS transistors, resistors and capacitors instead of a net list of the cell level. It is therefore forced to use the circuit simulator such as the above-mentioned SPICE or a switch-level simulator regarding the MOS devices as switches for effecting the simulation. Therefore, the processing scale is 1/1000 to 1/10000 and the processing speed is 1/1000 to 1/10000 compared with those of the ordinary logic simulation.

In order to correctly back-annotate a full manual layout design, on the other hand, it becomes necessary to use the above-mentioned simulator. When importance is given to the processing speed instead of giving importance to precision, however, there is no proper method. Also, there is no method for converting the simulated result of the circuit so that it can be treated by a logic simulator.

That is, according to the prior art, a predetermined correctly designed circuit is back-annotated using a circuit simulator. Here, however, the delay of the circuit is back-annotated with the connection condition among the elements as a reference, which is not suited for high-speed and large-volume processing. On the other hand, there exists a logic simulator capable of executing operation processing at high speeds and in large volumes though the precision is sacrificed to some extent. According to this logic simulator, however, the delay in the circuit is back-annotated with the connection condition among the cells as a reference, making it difficult to use net list data extracted from the layout data adapted to the circuit simulator.

SUMMARY OF THE INVENTION

The object of the present invention is to provide an apparatus for forming input data for a logic simulator and a method of forming input data for a logic simulator, which execute a process to convert a net list using, as bases, elements used in a known circuit simulation such as SPICE or the like into a net list using cell units as bases so that it can be handled by a logic simulator, in order to feed the net list to the logic simulator, overcoming the problems inherent in the prior art.

In order to accomplish the above-mentioned object, the present invention basically employs a technical constitution that is described below. That is, an apparatus for forming input data for a logic simulator for semiconductor device constituted by processing means which, from a net list constituted by connection data among the elements which is used as units including parasitic resistances and parasitic capacitances, excludes parasitic resistances and parasitic capacitances that are completed in a cell and, feeds to a logic simulator, the data related to nets, parasitic resistances and parasitic capacitances and not excluded from the nets. More concretely, an apparatus for forming input data for a logic simulator for semiconductor integrated circuits comprises at least layout data-holding means for holding data using elements of semiconductor integrated circuits as units; basic net list data-holding means; net list-forming means for forming a net list constituted by connection data among the elements as units, including parasitic resistances and parasitic capacitances, based upon the data stored in said layout data-holding means and said basic net list data-holding means; processing means for deleting nets, parasitic resistances and parasitic capacitances that are completed in a cell, and for forming data related to other nets, parasitic resistances and parasitic capacitances for a net list formed by said net list-forming means; and feeding means for feeding data output from said processing means to the logic simulator.

As explained above, the most characteristic feature of the present invention is such that, in order to easily verify the timing of a semiconductor integrated circuit fabricated by a full manual layout system, utilizing a logic simulator, first, all elements, net data, parasitic resistances and parasitic capacitances are extracted from a layout data, second, the certain number of the elements thus extracted are divided into a plurality of groups, each group having a suitable cell-unit, third, some of the nets, parasitic resistances and parasitic capacitances which are not needed for calculating the delay time of the group of the cell-unit, are selected and deleted from the group of the cell-unit, fourth, the delay time is calculated for each one of the cell-units and, fifth, the delay time data is supplied to the logic simulator.

Namely, the apparatus for forming input data for a logic simulator of the present invention forms, at the time of designing a semiconductor integrated circuit, a net list such as SPICE constituted by connection data among the elements including parasitic resistances and parasitic capacitances using elements as units relying upon data stored in a layout data-holding means that is holding data related to the arrangement of element units of the semiconductor integrated circuit and in a basic net list data-holding means, divides a group of a plurality of elements constituting said net list into groups of predetermined units of cells, excludes nets, parasitic resistances and parasitic capacitances that are completed in a cell for each of the cells, calculates a delay time of the cell from the data related to other nets, parasitic resistances and parasitic capacitances, and forms input data inclusive of delay time data for a logic simulator. In verifying the timings of a semiconductor integrated circuit of the full manual layout system, therefore, the simulation processing can be executed using a logic simulator based on the input data for the logic simulator at a high speed though the simulation precision is slightly inferior to that of the case of the circuit simulator. In terms of the same semiconductor integrated circuit constitution, therefore, the processing scale can be increased to 1000 to 10000 times as large and the processing speed can be increased to 1000 to 10000 times as fast as those of the conventional circuit simulation or the switch-level simulation.

BRIEF DESCRIPTION OF THE DRAWINGS

FIG. 5 shows a net list in a SPICE net list library (SPICE-Lib) used in the present invention.

FIG. 9 illustrates a net list extracted from the layout data of the present invention.

DETAILED DESCRIPTION OF THE PREFERRED EMBODIMENT

A concrete embodiment of a back-annotation device according to the present invention will now be described in detail with reference to the drawings.

Figure 1:
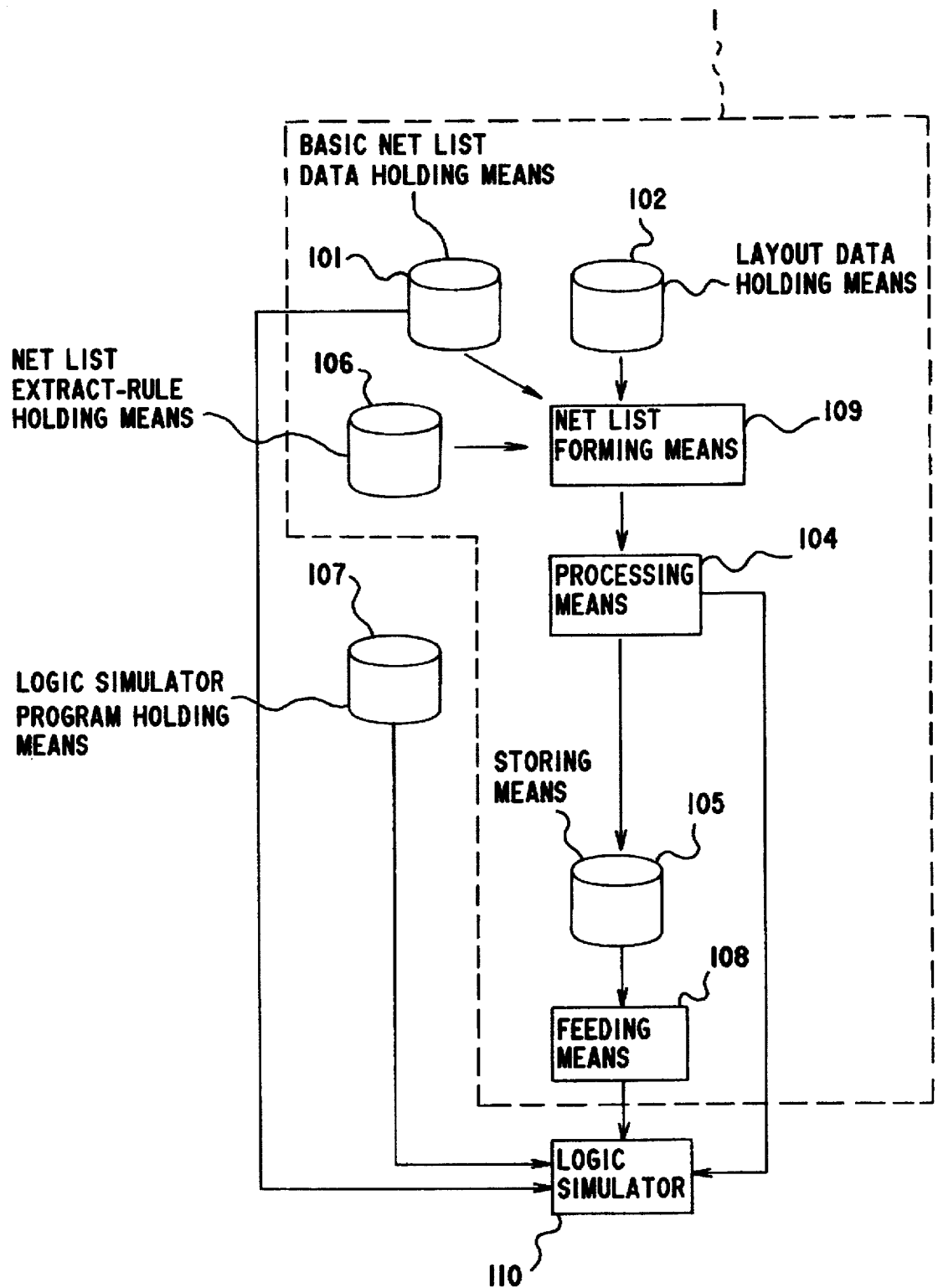
FIG. 1 is a block diagram explaining the principle of an apparatus for forming input data for a logic simulator according to the present invention and further illustrating the constitution of the apparatus for forming input data for the logic simulator according to the present invention.

FIG. 1 is a block diagram which schematically illustrates the constitution of an apparatus for forming input data for a logic simulator according to an embodiment of the present invention and a principle thereof. That is, FIG. 1 illustrates an apparatus 1 for forming input data for a logic simulator constituted by processing means 104 which, for a net list which uses elements as units and is constituted by connection data among the elements including parasitic resistances and parasitic capacitances, feeds, to a logic simulator, the data related to nets, parasitic resistances and parasitic capacitances but excluding those nets, parasitic resistances and parasitic capacitances that are completed in a cell. More specifically, FIG. 1 illustrates an apparatus 1 for forming input data for a logic simulator for semiconductor integrated circuits comprising at least layout data-holding means 102 for holding data using elements of semiconductor integrated circuits as units; basic net list data-holding means 101; net list-forming means 109 for forming a net list constituted by connection data among the elements including parasitic resistances and parasitic capacitances with elements as units based upon the data stored in said layout data-holding means 102 and said basic net list data-holding means 101; processing means 104 for deleting nets, parasitic resistances and parasitic capacitances that are completed in a cell, and for forming data related to other nets, parasitic resistances and parasitic capacitances for a net list formed by said net list-forming means 109; and feeding means 108 for feeding data output from said processing means 104 to the logic simulator 110 via a suitable storage means 105 that is provided as required.

In FIG. 1, furthermore, provision is made, as required, of a net list extract rule-holding means 106 for holding a rule that determines parasitic resistances and parasitic capacitances that develop among the elements, and a logic simulator program-holding means 107 for constituting the apparatus for forming input data for a logic simulator of the present invention.

That is, the logic simulator means 110 according to the present invention is so constituted as to execute a predetermined logic simulation depending upon a logic simulation program fed from the storage means 107.

The output of the processing means 104 in the apparatus 1 for forming input data for the logic simulator of the present invention includes delay time data, that will be described later, for each of the cells.

In general, to the logic simulator must have been input at least a net list of, for example, a semiconductor integrated circuit that is to be verified, delay time data, and a predetermined input waveform of the semiconductor integrated circuit set by a designer. In the apparatus for forming input data for the logic simulator of the present invention, therefore, the net list and the delay time data are fed to the logic simulator. Depending upon the cases, however, the above-mentioned basic net list may be directly fed to the logic simulator 110, and the delay time data found by the processing means 104 may be fed to the logic simulator 110.

The net list used in the present invention is a data list, as shown, for example, in FIG. 9, describing connection data, among the elements constituting the semiconductor integrated circuit, that are extracted from the layout data of the semiconductor integrated circuit, which, however, does not include positional relationships among the elements.

The cell used in the present invention represents a state in which elements having known delay time data or elements defining delay times are connected to each other via a net. The cell may be constituted with the element as a unit or may be a circuit in which a plurality of element groups are combined together. When the delay time of the circuit has been defined in advance, such a circuit unit may be handled as a cell.

In this case, the delay times must have been defined for each of the patterns of combinations of a considerable number of element groups.

According to the present invention, furthermore, the state in which the net is completed in the cell stands for a state where the connection is completed among the elements in the cell.

The processing means 104 of the present invention calculates the delay time of the wiring that serves as the output of the cell for each of the predetermined cell units in the net list formed by said net list-forming means 109. For this purpose, the processing means 104 excludes the nets, parasitic resistances and parasitic capacitances that are completed in the cell, and calculates the delay time of the cell based upon other nets, parasitic resistances and parasitic capacitances.

According to the present invention, furthermore, exclusion of the parasitic resistance means that either one of the two nets in which the parasitic resistance is connected to the cell provided in the net is directly connected to the other net.

Moreover, the feeding means 108 of the present invention feeds delay time data, of the cells, output by the processing means 104 to the logic simulator 110. The feeding means 108 may directly feed the delay time data in the cells output by the processing means 104 to the logic simulator 110. Depending upon the cases, the delay time data in the cells output by the processing means 104 may be stored in a suitable storage means 105, and the delay times stored in the storage means 105 may be fed, as required, to the logic simulator 110.

The feeding means 108 according to the present invention may, first, feed the basic net list 101 itself to the logic simulator 110 and may then feed the delay time data for the cells constituting the net list processed by the processing means 104 to the logic simulator 110.

Briefly described below is the basic procedure of operation in the apparatus 1 for forming input data for the logic simulator according to the present invention.

In FIG. 1, the layout data-holding means 102 stores layout data including circuit constitution data using, as bases, elements such as transistors of a semiconductor integrated circuit that is to be back-annotated, and the basic net list data-holding means 101 stores basic data related to the connection data of the net in the basic circuit or in the cell.

The basic data related to parasitic resistance and parasitic capacitance that must be taken into consideration in the net list of the semiconductor integrated circuit that is to be back-annotated are stored in the net list extract rule-holding means 106. In forming the net list, the resistances and capacitances parasitic on predetermined portions can be found from the length of the wiring calculated from the layout data and from the data of the wiring width.

Based upon the predetermined data selected from the layout data-holding means 102, the net list extract rule-holding means 106 and the basic net list data-holding means 101, the net list-forming means 109 forms a net list using elements such as transistors as bases.

The above net list includes data related to parasitic resistances and parasitic capacitances parasitic on the wirings among the elements, i.e., parasitic on the net in addition to the elements such as transistors.

It can be said that the thus formed net list is equivalent to, or close to, the type of SPICE that has heretofore been used.

In the present invention, the net list which is constituted based upon the elements is not suited for being directly and logically simulated by the logical simulator 110. Therefore, the type of the net list must be changed into the one based upon the cells, so that it can be logically simulated by the logical simulator.

That is, in the present invention, the net list formed by the net list-forming means 109 is divided into groups of cell units of the above-mentioned predetermined size having a predetermined function, the connection data in the thus divided cell groups are checked to make sure whether a net connected to a predetermined element such as MOS transistor is completed in the cell or not and to judge whether the parasitic resistance or parasitic capacitance parasitic on the net is necessary for calculating the delay time in the cell or not, the parasitic resistance or the parasitic capacitance that is judged to be unnecessary is temporarily deleted from the net list, and the delay time of the cell is calculated by using the cell and the parasitic resistance or the parasitic capacitance left on the net list.

According to the present invention, at this stage, the layout data read out from the layout data-holding means 102 are collated with the net list read out from the basic net list data-holding means 101, and a particular instance name or a net name inherited from the basic net list is allocated to the individual elements which may be MOS transistors in the net list that is extracted or to the net.

By making reference to the above-mentioned instance name or the net name, therefore, the cell units can be easily divided into groups.

That is, the net list formed by the above-mentioned net list-forming means 109 is converted into a form that can be processed by the logic simulator program, the conversion being effected by the conversion processing means 104 that executes the above-mentioned conversion operation. For instance, a plurality of MOS devices that were the same cells in the initial net list are contracted into a single group based on the instance name allocated by the net list-forming means 109, and parasitic resistances and parasitic capacitances that are not needed for calculating the delay times of the cells divided into groups, are temporarily deleted from the layout data.

According to another method, a plurality of MOS transistors that were standard cells can be contracted into a single group based upon physical recording positions in the net list extracted from the layout data.

After the conversion operation is executed by the processing means 104, parasitic resistances and parasitic capacitances that are not needed for calculating the delay time for each of the cells as a unit, are temporarily deleted from the layout data based upon the net list that is converted, and the results are stored in, for example, a suitable storage means 105.

According to the present invention, the thus obtained net list may be directly fed to the logic simulator 110 or the basic net list may be offered to the logic simulator 110.

In this case, it need not be pointed out that the delay time data of the cells in the net list must be fed to the logic simulator 110.

That is, in the apparatus for forming input data for a logical simulator of the present invention, first, all elements, net data, parasitic resistances and parasitic capacitances are extracted from the layout data, and predetermined elements are divided into groups of a suitable units of cells as defined above. Then, only those nets, parasitic resistances and parasitic capacitances that are not needed for calculating the delay times are selected for each of the cells, are deleted and, then, delay times are calculated for each of the cells, and the results are stored in a suitable memory such as storage means 105.

After the calculation of a predetermined delay time is finished for a selected cell, the parasitic resistances and parasitic capacitances that were deleted are returned to their initial positions in the net list. Then, on operation the same as the one mentioned above is executed for another cell, and the obtained delay time of the cell is similarly stored in a suitable memory such as storage means 105.

After the calculation of delay time is finished for all cells in the net list, the delay time data related to the cells stored in a suitable memory such as storage means 105 and the input data for a logic simulator which are the net list data, are fed to the logic simulator 110 by using the feeding means 108 or the like.

The logic simulator makes it possible to logically simulate, at a high speed, the verification of timings of a semiconductor integrated circuit that uses a full manual layout system by using the net list input from the apparatus for forming input data for a logic simulator of the present invention, delay time data and a predetermined input waveform input by a designer who has designed the semiconductor integrated circuit. The logic simulator is particularly effective when it is desired to carry out the simulation at high speed without giving great importance to the precision of the simulation.

If generally described, the method of forming input data for a logic simulator of the present invention comprises, basically, a first step for preparing a net list that uses elements as units and is constituted by connection data among the elements including parasitic resistances and parasitic capacitances; a second step for dividing a group of a plurality of elements constituting said net list into groups of predetermined units of cells; a third step which, when there exist nets, parasitic resistances and parasitic capacitances that are completed in said cell, excludes the presence of said nets, parasitic resistances and parasitic capacitances, and calculates the delay time in said cell based upon the data related to other nets, parasitic resistances and parasitic capacitances; a fourth step for repeating said third step for all of the cells constituting said net list; and a fifth step which feeds the delay time data of said cells to the logic simulator when the processing for calculating the delay time is completed for all of the cells constituting said net list.

Figure 8:
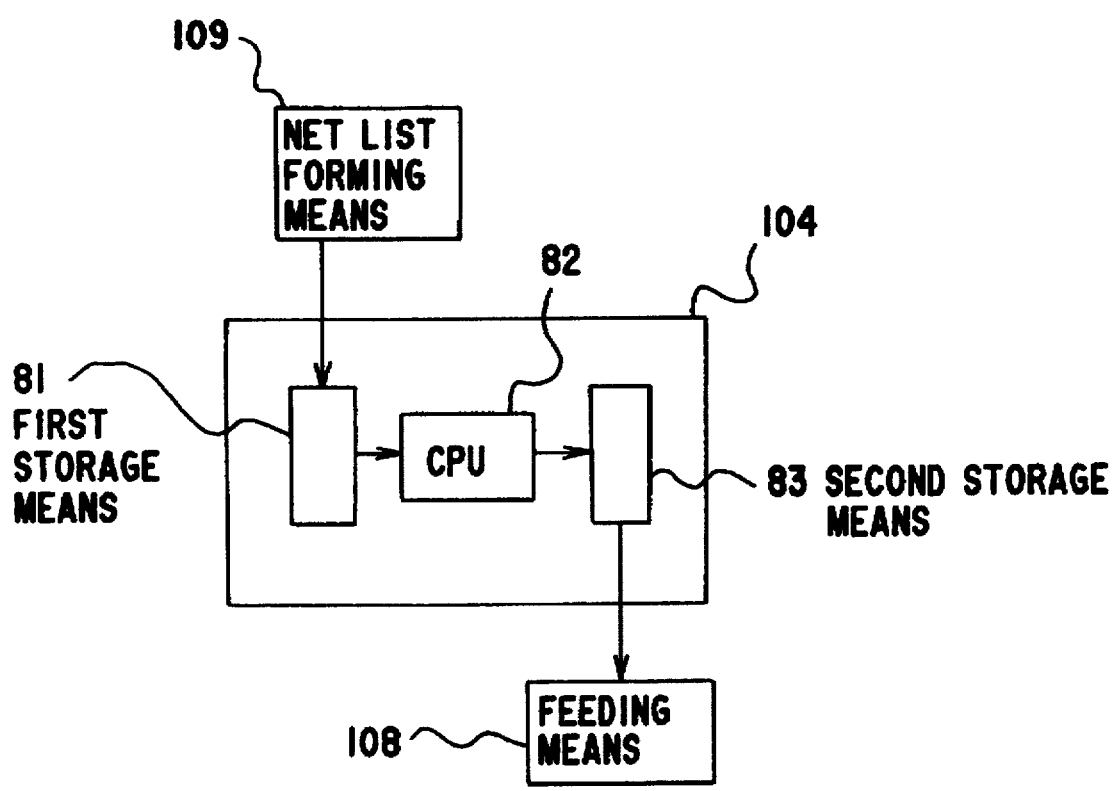
FIG. 8 is a block diagram illustrating the constitution of a processing means according to the present invention.

As shown in, for example, the block diagram in FIG. 8, furthermore, the processing means 104 that is used in the present invention is constituted by at least a first storage means 81 which is connected to the net list-forming means 109 and receives necessary data from the net list data formed by said net list-forming means and temporarily stores the data, an operation means 82 constituted by a CPU or the like which reads said net list data from said first storage means 81, deletes nets, parasitic resistances and parasitic capacitances that are completed in a cell but are not necessary for calculating the delay times of the cells, and calculates a delay time of a predetermined cell based upon the data related to other nets, parasitic resistances and parasitic capacitances, and second storage means 83 for temporarily storing delay time data for each of the cells calculated by said operation means 82, said second storage means 83 being connected to said feeding means 108 that feeds said delay time data to the logic simulator.

In the processing means 104 of the present invention, the calculation means 82, and the first and second storage means 81, 83 may be mounted on the same chip. Or, the storage means 81 and 83 may be constituted by the same storage circuit.

The second memory means 82 of the present invention may also work as the above-mentioned storage means 105.

A concrete embodiment of the apparatus for forming input data for a logic simulator of the present invention will now be described in detail with reference to FIGS. 2 to 7.

Figure 2:
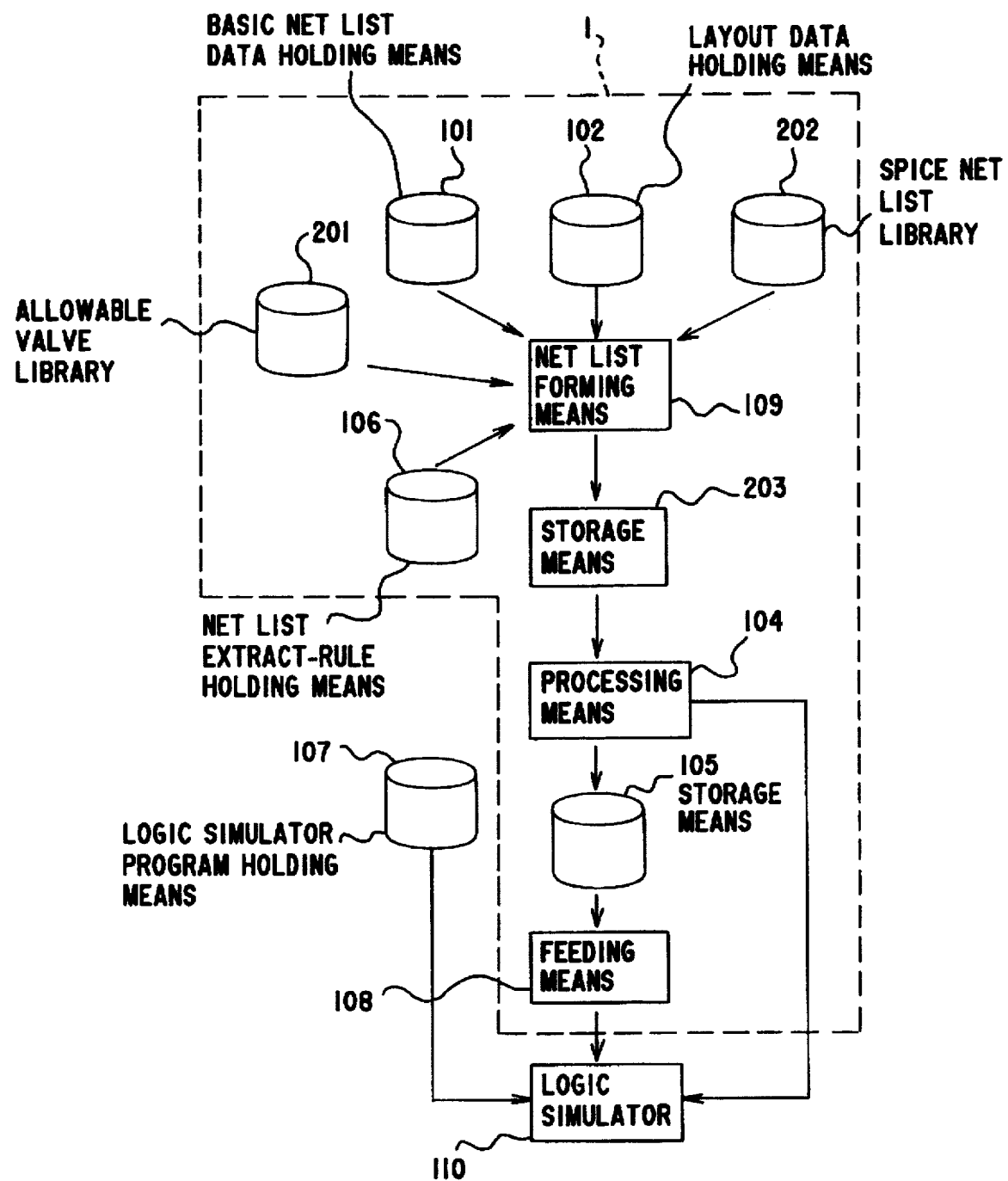
FIG. 2 is a block diagram illustrating the constitution of the apparatus for forming input data for the logic simulator according to another embodiment of the present invention.

FIG. 2 is a block diagram which illustrates in detail the concrete constitution of the apparatus for forming input data for a logical simulator according to the present invention, wherein means exhibiting the same functions as those of FIG. 1 are denoted by the same reference numerals as those of FIG. 1 and their description is not repeated here. Only those means newly added and functions different from those of FIG. 1 will be described.

According to another embodiment of the present invention shown in FIG. 2 as in the apparatus 1 for forming input data for a logic simulator having basic constitution of the invention shown in FIG. 1, there is provided an apparatus 1 for forming input data for a logic simulator comprising at least layout data-holding means 102 for holding data using elements of semiconductor integrated circuits as units; basic net list data-holding means 101; net list extract rule-holding means 106 for holding rules that determine parasitic resistances and parasitic capacitances occurring among the elements; net list-forming means 109 for forming a net list constituted by connection data among the elements including parasitic resistances and parasitic capacitances with elements as units based upon the data stored in said layout data-holding means 102 and said basic net list data-holding means 101; processing means 104 for deleting nets, parasitic resistances and parasitic capacitances that are completed in a cell, and for forming data related to other nets, parasitic resistances and parasitic capacitances for a net list formed by said net list-forming means 109; and feeding means 108 for feeding data output from said processing means 104 to a logic simulator 110 via a suitable storage means 105 which is provided as required, the logic simulator 110 executing a predetermined logic simulation according to a logic simulation program fed from the storage means 107.

According to the second embodiment of the present invention, furthermore, provision is made of a SPICE net list library (SPICE-Lib) 202 that is used for expanding a net list that is described in a soft ware manner on a cell-based level and is stored in the basic net list data-holding means 101 into a net list of MOS devices, and an allowable value library 201 for setting the upper limit of the parasitic resistance or parasitic capacitance that will be described later.

In the apparatus 1 for forming input data for a logical simulator shown in FIG. 2, the net list data formed by the net list-forming means 109 can be stored in a storage means 203 or the like.

The storage means 203 may be the one that also works as the first storage means 81 shown in FIG. 8.

FIG. 3 illustrates an example of the basic net list stored in the basic net list data-holding means 101 in the apparatus for forming input data for the logical simulator according to the present invention.

Figures 3A, 3B:
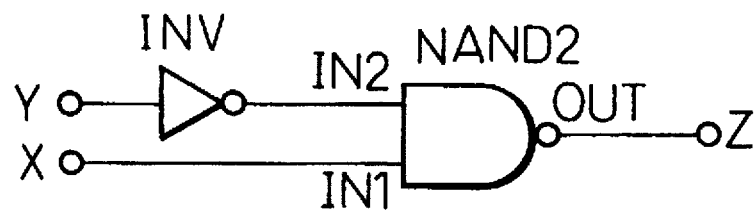
FIG. 3A shows a program of a basic net list used in the apparatus for forming input data for the logic simulator according to the present invention.
FIG. 3B is a circuit of a logic block which is the source of the net list of FIG. 3A.

That is, the basic net list of FIG. 3A is the one in which a circuit shown in, for example, FIG. 3B is described in a software manner, and its model name is designated to be CIR1, the input is designated to be INPUT:X, Y and the output is designated to be OUT:Z.

Connection conditions at the terminal portions are described at the lower portions thereof.

In the basic net list of FIG. 3A, IO1 and IO2 are called instance names, and INPUT:X, Y and OUT:Z are called node names.

Figure 4A:
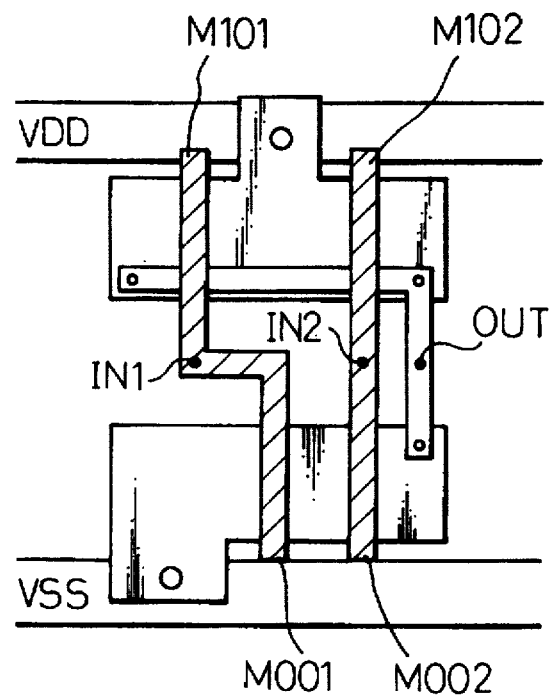
FIG. 4A is a plan view of the layout data used in the present invention.

On the other hand, the layout data stored in the layout data-holding means 102 used in the apparatus 1 for forming input data for a logic simulator of the present invention will be the one in which a diagram showing the arrangement of transistors as shown, for example, in FIG. 4A is described as data.

Figure 4B:
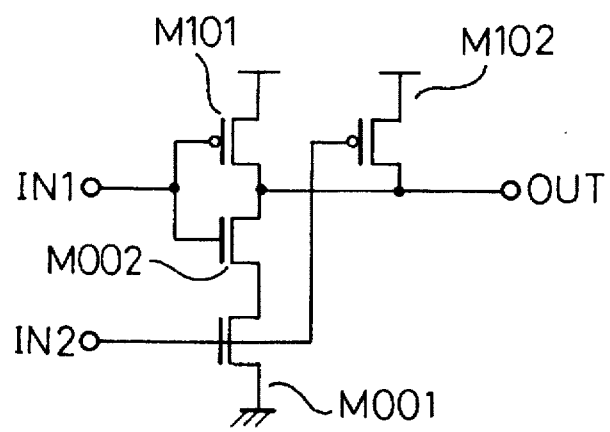
FIG. 4B is a circuit diagram of a cell-based level which is the source of the layout data of FIG. 4A.

The layout data of FIG. 4A form a NAND gate circuit as shown, for example, in FIG. 4B.

In the SPICE net list library (SPICE-Lib) 202 used in the embodiment of the present invention are described in a software manner the connection data of all MOS transistors used for the layout data, the type thereof, and width and length of wiring, in the manner shown in FIG. 5.

Such data are necessary for expanding a logic circuit shown in the net list into a net list made up of MOS transistors and for dividing the net list into groups of predetermined cells.

That is, in the SPICE net list data in the SPICE net list library (SPICE-Lib) 202 shown in FIG. 5, the NAND gate circuit shown in FIG. 4B is described in a software manner for each of the MOS transistors.

According to the embodiment, next, the net list-forming means 109 forms a SPICE format including, for example, a predetermined net, parasitic resistance and parasitic capacitance, and forms net list data for conversion (such an operation is generally called "extracting") that will be used in the following steps based upon predetermined data selected from the net list extraction rule-holding means 106 storing basic data related to parasitic resistances and parasitic capacitances that will have to be taken into consideration in the layout data of a semiconductor integrated circuit that is to be back-annotated, layout data-holding means 102 and basic net list data-holding means 101, as well as based upon the SPICE net list data stored in the SPICE net list library (SPICE-Lib) 202.

Figure 6:
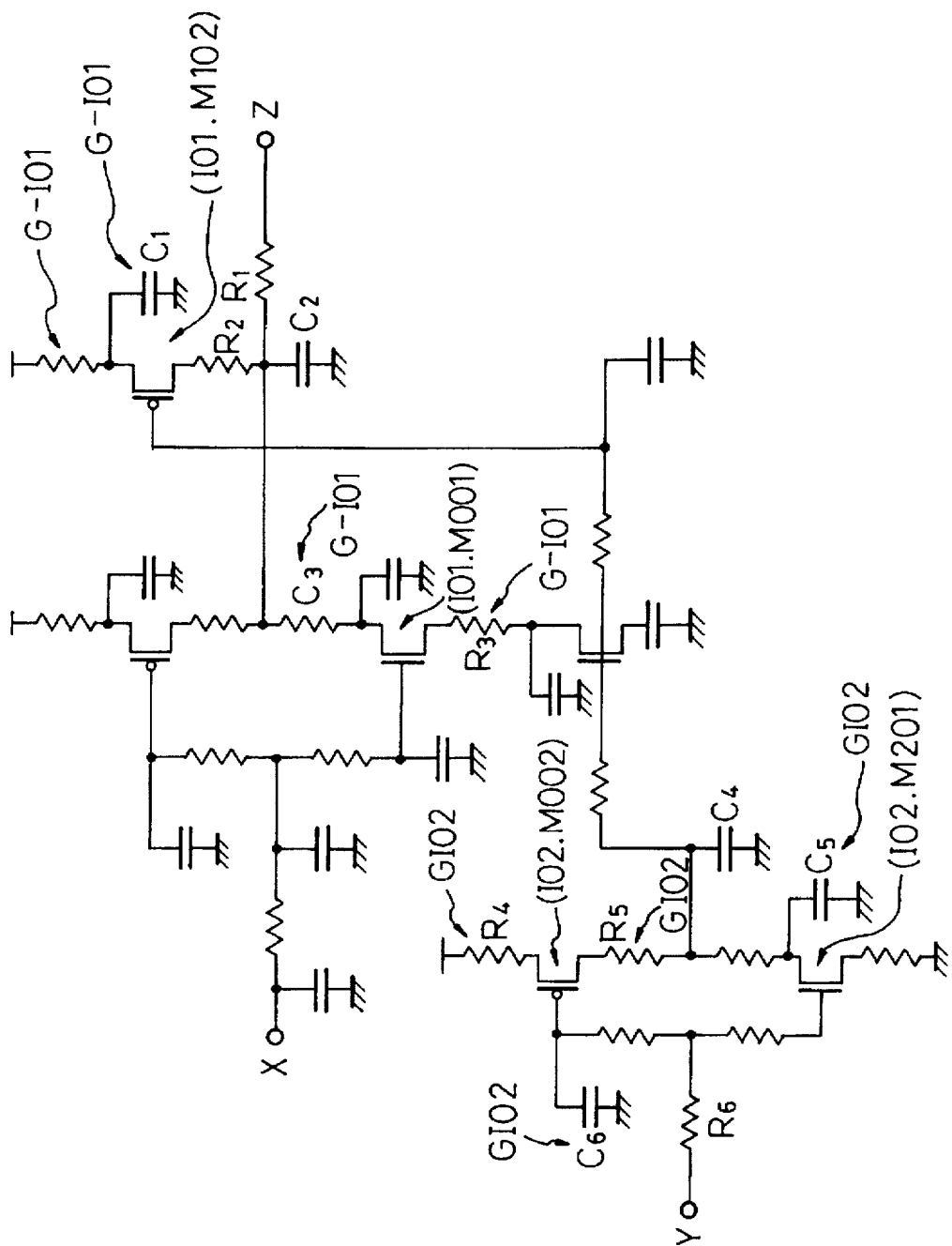
FIG. 6 is a circuit diagram in which a conversion net list used in the present invention is restored by using elements, parasitic resistances and parasitic capacitances.

FIG. 6 is a circuit diagram specifying elements, parasitic resistances and parasitic capacitances constituting the circuit according to a net list for conversion formed by the net list-forming means 109 of the present invention.

In the net list of FIG. 6, the logic circuit shown in FIG. 3B is expressed as a net list of the cell-based layout system in which predetermined parasitic resistances and parasitic capacitances have already been inserted and arranged.

Depending upon the case, the thus formed SPICE format is temporarily stored in the storage means 203 or the like.

In this case, a plurality of SPICE formats stored in the storage means are often called SPICE net list.

As for the instance names and the continuing node names used in the MOS transistor devices, parasitic resistances and parasitic capacitances included in the SPICE net list stored in the storage means 203, it is desired that the names be inherited when they correspond to the names in the basic net list stored in the basic net list data-holding means 101.

The net list stored in the net list data-holding means 101 being described on the cell level can be made to correspond to the layout data for conversion described on the MOS device level by connecting the instance name of a corresponding MOS device on the SPICE net list library (SPICE-Lib) 202 via a period "." right after the instance name of a cell to which the MOS device of the net list for conversion was belonging on the basic net list of the basic net list data-holding means 101.

For instance, displays "IO1.M102" and "IO1.M001" shown in FIG. 6 indicate the results of the above-mentioned operation.

Thereafter, the net list for conversion executes the same operation as the one explained with reference to the apparatus for forming input data for a logic simulator of FIG. 1 and the method of operation thereof, whereby input data for a logic simulator is formed, and are fed to the logic simulator 110 via storage means 105 or the like and where a predetermined process is executed according to a logic simulator program stored in the logic simulator-holding means 107 to execute the back-annotation.

The spice net list included in a net list for conversion formed through the above-mentioned steps includes data related to nodes in the cell, which, however, are not necessary in the desired logic simulation and must be deleted.

In the calculation by the processing means 104 in the apparatus 1 for forming input data for a logic simulator according to the present invention, the nodal portion, parasitic resistance and parasitic capacitance that are not necessary for the logical simulation are temporarily deleted, and the delay time between predetermined cells is fed to the logical simulator 110.

According to the present invention as described above, the elements must be divided into groups of cells of a predetermined size. By using the instance names, therefore, all of the MOS devices in the conversion layout data are grouped according to a character sequence up to "." which is an instance name at the cell-based level.

In the conversion layout data in FIG. 6, for instance, the MOS devices indicated as "IO1.M102" and "IO1.M001" can be contracted into the same group, and MOS devices indicated as "IO2.M002" and "IO2.M201" can be contracted to the same group.

According to the present invention, next, in order to calculate delay time of a single element or of a plurality of elements constituting a cell in a group, it is judged whether the net connected to the element is completed in the cell or not. When the predetermined net is not completed in the cell, the parasitic resistances and parasitic capacitances connected to the net are temporarily deleted from the cell as being unnecessary for calculating the delay time of the element.

Described below are methods of judging whether such unnecessary parasitic resistances and parasitic capacitances can be temporarily deleted.

According to the first method, parasitic resistance and parasitic capacitance indicated on the conversion net list are all checked in regard to whether the terminals thereof, of either side, are connected to any one of the source, gate or drain of the MOS devices belonging to the same cell group, and those that are connected to any one of the source, gate or drain thereof are included in the cell group.

Referring, for instance, to FIG. 6, a parasitic resistance R1 has both its terminals directly connected to none of the source, gate or drain of the MOS device and is excluded from the object that should be grouped. However, a parasitic resistance R2 has one terminal directly connected to the drain of a MOS device and a parasitic resistance R3 has both its terminals directly connected to the source and drain of MOS devices and are, hence, included in a MOS device group divided using the instance name IO1.

A parasitic resistance R6 has both its terminals directly connected to none of the source, gate or drain of the MOS device and is excluded from the object that should grouped. However, a parasitic resistance R4 has its one terminal that is directly connected to the drain of a MOS device and a parasitic resistance R5 has its both terminals that are directly connected to the source and drain of MOS devices and are, hence, included in a MOS device group divided by the instance name IO2.

As for the parasitic capacitance, on the other hand, those of which the terminals of the side that is not grounded are directly connected to any one of the source, gate or drain of the MOS devices are regarded to belong to those that should be grouped. Concretely speaking, and as shown in FIG. 6, parasitic capacitances C1 and C3 have their terminals on one side that are directly connected to the sources of MOS devices, and are grouped in a form being included in the MOS device group divided by the instance name IO1. However, a parasitic capacitance C2 of which the terminal on one side is not directly connected to the source of the MOS device is excluded from the object that should be grouped.

A parasitic capacitance C4 has a terminal on one side that is not directly connected to the source of a MOS device and is excluded from the object that should be grouped. However, parasitic capacitances C5 and C6 have terminals on one side that are directly connected to the source and drain of MOS devices, and are grouped in a form to be included in a MOS device group divided by the instance name IO2.

That is, according to the present invention, parasitic resistances whose terminals on both sides lie in the same cell group, and parasitic capacitances whose terminals of the side that is not grounded lie in the cell group, are temporarily deleted for a given cell group, e.g., for the group IO1, this cell group is treated as a logic cell, a delay time between the logic cell that is grouped and a wiring connected thereto is calculated based on the remaining parasitic resistances and parasitic capacitances, and the results are output to the logic simulator.

Next, parasitic resistances and parasitic capacitances that were temporarily deleted are returned back to the initial forms, and the same operation is repeated for a cell group, e.g., a cell group IO2 that is different from the group IO1 that corresponds to the logic circuit of which the delay time was calculated. Thus, the delay time of a new logic circuit is calculated. When the above-mentioned processing is finished for all of the cell groups, the operation for forming the input data for the logic simulator is finished.

According to the present invention, the operation processing may be executed by using another format, having a descriptive ability equivalent to that of the net list of the SPICE net list library (SPICE-Lib) 202, instead of using the above-mentioned processing method.

In the operation processing in the apparatus for forming input data for the logic simulator according to the present invention, it is essential that the processing means 104 has a function for excluding nets, parasitic resistances and parasitic capacitances that are completed in a predetermined cell in the conversion net list formed by the net list-forming means 109, and for extracting other nets, parasitic resistances and parasitic capacitances.

According to a second method, the processing means 104 in the apparatus for forming input data for a logic simulator of the present invention, in other words, has a function which excludes parasitic resistances and parasitic capacitances on a conversion net list formed by the net list-forming means 109, eliminates mismatching at the time of back-annotation (i.e., excludes data of parasitic resistances and parasitic capacitances), and extracts other nets, parasitic resistances and parasitic capacitances when the net expressed by a terminal of a cell expressed by a symbol is divided into two or more nodes, i.e., is divided into groups.

Moreover, according to the present invention, the processing means 104, in other words, has a function which excludes parasitic resistances at the time of calculating the delay time of the cell but does not exclude parasitic resistances at the time of calculating the delay time of a passing net (i.e., has a function for returning those that were temporarily deleted to the initial form) when a net expressed by a terminal of a cell expressed by a symbol is divided or is grouped into two or more nodes and is further serving as a passing point for other nets.

According to a third method, furthermore, the processing means 104 of the apparatus for forming input data for the logic simulator of the invention judges whether the parasitic resistances and parasitic capacitances exist in a standard cell by comparing the presence of parasitic resistances and parasitic capacitances completed in a cell in the conversion net list formed by the net list-forming means 109 with the net list of a standard cell that has been registered beforehand in the basic net list data-holding means 101, and, when they exist in the standard cell, calculates the delay time of the cell by excluding them.

Moreover, the processing means 104 in the apparatus for forming input data for the logic simulator according to the present invention may have a function for comparing allowable resistances and allowable capacitances in the cell for each of the standard cells stored in the allowable value data-holding means 201 at the time of excluding parasitic resistances and parasitic capacitances in the cell, and for outputting alarm data for the parasitic resistances and parasitic capacitances that exceed allowable values.

Figure 7:
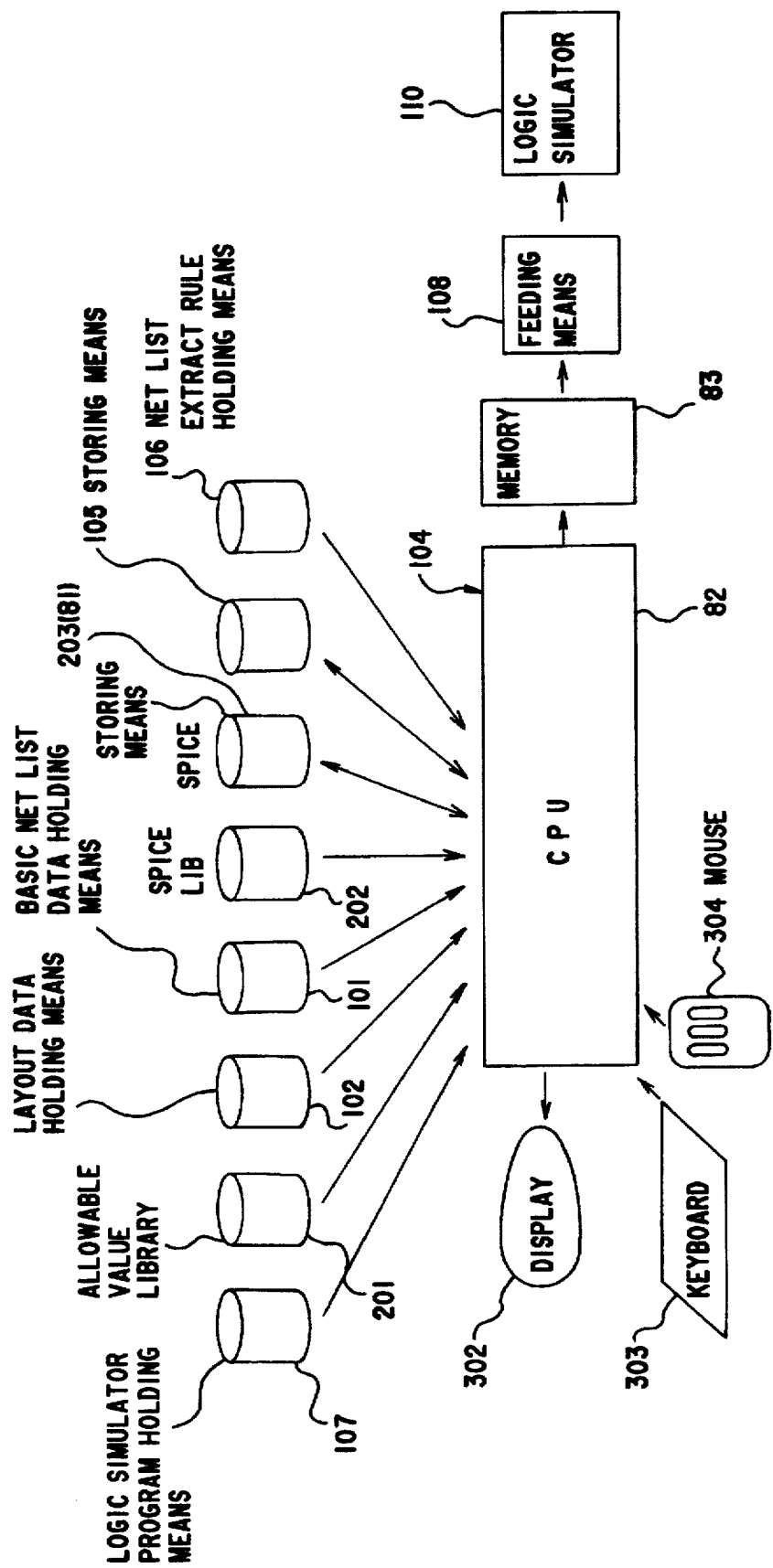
FIG. 7 is a block diagram illustrating a practical hardware constitution of the apparatus for forming input data for the logic simulator according to the present invention.

FIG. 7 illustrates a practical hardware constitution of the apparatus 1 for forming input data for the logic simulator according to the present invention.

In FIG. 7, the apparatus 1 for forming input data for the logic simulator is further provided with storage means 203 for storing net list data such as SPICE net list data, operation means 300 constituted by CPU, etc., display means 302, keyboard 303, mouse 304, memory means 105 for temporarily storing the delay data, and memory means 83 having a function for temporarily buffering the net list and delay time data to feed them to the logic simulator 110, in addition to means shown in FIG. 2.

According to the present invention which uses the apparatus for forming input data for the logic simulator of the present invention having the aforementioned technical constitution, the input data are fed to the logic simulator to back-annotate the logically designed circuit in designing a semiconductor integrated circuit making it possible to simulate, at high speed, the verification of timings of the semiconductor integrated circuit utilizing the full manual layout system though the simulation cannot be precise, and back-annotation is executed maintaining a processability which is 1000 to 10000 times as great in processing scale and is 1000 to 10000 times as fast in processing speed compared with those of the conventional circuit simulation or switch-level simulation.

I claim:

1. An apparatus for forming input data for a logic simulator which simulates and verifies timing in a semiconductor integrated circuit, said apparatus comprising:

memory means for storing a net list comprising connection data among circuit elements of a semiconductor device, said connection data including parasitic resistances and parasitic capacitances;

processing means connected to said memory means for processing said net list as a plurality of cells, said processing means excluding parasitic resistances and parasitic capacitances which are completed in a cell of said plurality of cells, said processing means outputting data from said net list related to nets, parasitic resistances, and parasitic capacitances which are not excluded from the net list, thereby forming input data for a logic simulator at the logic cell level.

2. An apparatus according to claim 1, said apparatus further comprising:

layout data-holding means connected to said memory means for holding data regarding the circuit elements of the semiconductor integrated circuit as units;

basic net list data-holding means connected to said memory means for holding basic net list data;

net list-forming means connected to said processing means for forming the net list comprising the connection data among the circuit elements of the semiconductor device, based upon the data stored in the layout data-holding means and the basic net list data-holding means;

wherein said processing means removes nets, parasitic resistances, and parasitic capacitances that are completed in said cell, and forms data relative to other nets, parasitic resistances, and parasitic capacitances for net lists formed by the net list-forming means; and feeding means coupled to said processing means for feeding data output from the processing means to the logic simulator.

3. An apparatus as recited in claim 2, wherein said processing means comprises excluding means for excluding the parasitic resistances and parasitic capacitances, and for excluding nets, which are completed in the cell in the plurality of cells, said processing means also calculating a delay time of wiring for the cell based upon other nets, parasitic resistances, and capacitances.

4. An apparatus as recited in claim 3, wherein said feeding means feeds data representing the delay time in each of the cells based upon output from the processing means, to the logic simulator.

5. An apparatus according to any of claims 1 to 4, wherein said excluding means excludes parasitic resistance and extracts only data related to other nets, other parasitic resistances, and other parasitic capacitances when a net connected to a cell is represented by a symbol in the net list is divided into two or more nodes by the parasitic resistance associated therewith.

6. An apparatus according to any of claims 1 to 4, wherein when a net connected to a terminal of the cell represented by a symbol in the basic net list is divided into at least two nodes by the parasitic resistance, and wherein the cell serves as a passing cell for other nets, said processing means excludes the parasitic resistance when a delay time in the passing cell is calculated, and wherein the processing means includes the parasitic resistance when a delay time in the net connected to the terminal is to be calculated.

7. An apparatus according to any of claims 1 to 4, wherein the processing means compares the parasitic resistances and the parasitic capacitances in the net list with the parasitic resistances and parasitic capacitance of a cell that has been stored in the basic net list data-holding means, to determine whether the parasitic resistances and parasitic capacitances are within or without said cell, said processing means excluding the parasitic resistances and parasitic capacitances when they exist within the cell.

8. An apparatus according to any of claims 1 to 4, wherein the processing means includes allowable data-holding means, and wherein the processing means compares allowable resistances and allowable capacitances in each of a plurality of cells stored in the allowable data-holding means with each other, so that processing means outputting alarm data for parasitic resistances and parasitic capacitances which exceed said allowable resistances and allowable capacitances.

9. An apparatus according to any of claims 1 to 4, wherein said processing means divides data corresponding to the elements of the semiconductor device arranged in the net list into the plurality of cells, said processing means temporarily deleting the parasitic resistances of terminals connected to predetermined elements of the semiconductor device in a group, and for temporarily deleting parasitic capacitances of terminals of the predetermined elements which are not grounded, and wherein said processing means calculates delay time of wiring of the group based upon remaining nets, parasitic resistances, and parasitic capacitances, said processing means also returning the temporarily deleted parasitic resistances and capacitances to initial positions and repeating the temporary deletion of the parasitic capacitances and parasitic resistances and repeating the calculation of delay times for other predetermined groups of elements, said processing means halting operation after processing has been executed for all of the cells of the plurality of cells.

10. An apparatus according to claim 9, wherein said feeding means feeds delay time data for each of the plurality of cells to the logic simulator.

11. An apparatus according to claim 9, wherein the feeding means first feeds the net list data formed by the net list-forming means to the logic simulator, and when said feeding means then feeds delay time data for each of the cells to the logic simulator.

12. An apparatus according to claim 2, wherein said processing means comprises a first storage means for receiving and storing data from the net list data formed by the net list-forming means, operation means for reading the net list data from the first storage means, said operation means also deleting nets, parasitic resistances, and parasitic capacitances which are completed in a cell but are not used for calculation of the delay times of the cells, said operation means also calculating a delay time of a predetermined cell based upon data related to other nets, parasitic resistances, and parasitic capacitances, said processing means also comprising second storage means for temporarily storing delay time data for each of the plurality of cells calculated by the operation means, said second storage means being connected to said feeding means.

13. A method for forming input data for a logic simulator, said method comprising the steps of:

preparing a net list based upon data representing elements of a semiconductor device and connection data among the elements including parasitic resistances and parasitic capacitances;

dividing data of the net list into cell-groups having predetermined units of cells, each cell being based upon at least one element of the semiconductor device and corresponding connection data;

determining whether a predetermined cell has any nets, parasitic resistances, and parasitic capacitances completed therein;

excluding the presence of any nets, parasitic resistances and parasitic capacitances which are determined in the determining step to be completed in the cell;

calculating a delay time of the cell based upon data related to other nets, parasitic resistances, and parasitic capacitances;

repeating said determining step and said excluding step for each cell of the plurality of cells in the net list;

feeding the delay time data of the cells to the logic simulator after completion of calculation of the delay time for all of the plurality of cells.

* * * * *